(12) United States Patent
Lee et al.

(10) Patent No.: US 12,268,081 B2
(45) Date of Patent: Apr. 1, 2025

(54) DISPLAY DEVICE AND METHOD OF MANUFACTURING THE SAME

(71) Applicant: Samsung Display Co., LTD., Yongin-si (KR)

(72) Inventors: Jeong In Lee, Hwaseong-si (KR); Ho Yun Byun, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 344 days.

(21) Appl. No.: 17/333,006

(22) Filed: May 27, 2021

(65) Prior Publication Data

US 2022/0052282 A1     Feb. 17, 2022

(30) Foreign Application Priority Data

Aug. 13, 2020  (KR) .................. 10-2020-0101577

(51) Int. Cl.
| | |
|---|---|
| H01L 51/00 | (2006.01) |
| B32B 3/02 | (2006.01) |
| B32B 27/06 | (2006.01) |
| B32B 38/00 | (2006.01) |
| H10K 50/84 | (2023.01) |
| H10K 71/00 | (2023.01) |
| H10K 77/10 | (2023.01) |
| H10K 102/00 | (2023.01) |

(52) U.S. Cl.
CPC .............. *H10K 77/111* (2023.02); *B32B 3/02* (2013.01); *B32B 27/06* (2013.01); *B32B 38/0008* (2013.01); *H10K 50/841* (2023.02); *H10K 71/00* (2023.02); *B32B 2307/72* (2013.01); *B32B 2310/0843* (2013.01); *B32B 2457/20* (2013.01); *H10K 2102/311* (2023.02)

(58) Field of Classification Search
None
See application file for complete search history.

(56) References Cited

U.S. PATENT DOCUMENTS

| | | | |
|---|---|---|---|
| 2015/0043174 A1* | 2/2015 | Han | .................... G02F 1/13452 428/156 |
| 2015/0266272 A1* | 9/2015 | Lee | ......................... B32B 17/10 156/60 |

(Continued)

FOREIGN PATENT DOCUMENTS

KR     1020150017819 A     2/2015

OTHER PUBLICATIONS

Chris B. Schaffer et al., "Morphology of femtosecond laser-induced structural changes in bulk transparent materials," Applied Physics Letters, Mar. 2004, pp. 1441-1443, vol. 84, No. 9.

*Primary Examiner* — Anthony J Frost
(74) *Attorney, Agent, or Firm* — CANTOR COLBURN LLP

(57) ABSTRACT

A display device including a folding area includes a display panel, a cover window disposed above the display panel, and a protective film disposed on the cover window, where the protective film includes a first region and a second region including a same material as each other and having different moduli from each other. A modulus of the second region of the protective film is less than a modulus of the first region, and the second region is disposed in the folding area.

15 Claims, 21 Drawing Sheets

(56) References Cited

U.S. PATENT DOCUMENTS

| | | | |
|---|---|---|---|
| 2016/0039967 A1* | 2/2016 | Rukavina | B32B 9/005 |
| | | | 428/221 |
| 2016/0282978 A1* | 9/2016 | Wang | B32B 27/38 |
| 2017/0373121 A1* | 12/2017 | Leng | G09G 3/20 |
| 2018/0149904 A1* | 5/2018 | Song | G02F 1/133305 |

* cited by examiner

NFA: NFA1, NFA2

DISPLAY DEVICE AND METHOD OF MANUFACTURING THE SAME

This application claims priority to Korean Patent Application No. 10-2020-0101577, filed on Aug. 13, 2020, and all the benefits accruing therefrom under 35 U.S.C. § 119, the content of which in its entirety is herein incorporated by reference.

BACKGROUND

1. Field

The disclosure relates to a display device and a method of manufacturing the display device.

2. Description of the Related Art

Electronic devices that provide images to users, such as a smartphone, a tablet personal computer ("PC"), a digital camera, a laptop computer, a navigation device and a smart television, typically include display devices for displaying images.

Recently, a foldable display device has attracted much attention. Since the foldable display device has a wide screen with improved portability, it has desired features of both a smartphone and a tablet PC.

A protective film having high durability may be desired to be used in such display devices to protect internal components thereof, and thus may be formed to be hard.

SUMMARY

Embodiments of the disclosure provide a display device including a protective film having both impact resistance and flexibility, and a method of manufacturing the display device.

An embodiment of a display device including a folding area includes a display panel, a cover window disposed above the display panel, and a protective film disposed on the cover window, where the protective film includes a first region and a second region including a same material as each other and having different moduli from each other. In such an embodiment, a modulus of the second region of the protective film is less than a modulus of the first region, and the second region is disposed in the folding area.

An embodiment of a method of manufacturing a display device includes preparing a polymer film including a folding area, and radiating a laser to the folding area of the polymer film to form a first region and a second region having different moduli from each other, where a modulus of the second region of the polymer film is less than a modulus of the first region, and the second region is disposed in the folding area.

In accordance with embodiments of a display device, a protective film of the display device may have improved impact resistance and flexibility, and also have improved processing efficiency in manufacturing the display device.

BRIEF DESCRIPTION OF THE DRAWINGS

The above and other features of the disclosure will become more apparent by describing in detail embodiments thereof with reference to the attached drawings, in which.

DETAILED DESCRIPTION

Figure 1:
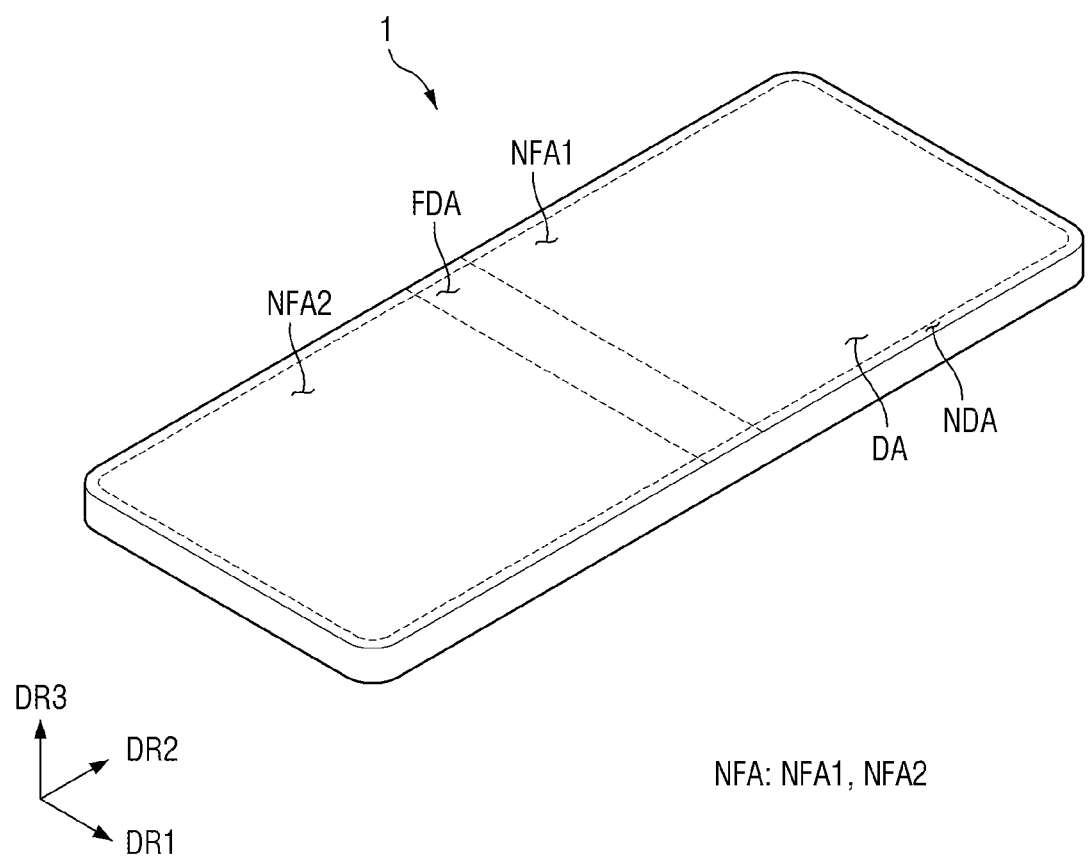
FIG. 1 is a perspective view illustrating a display device in an unfolded state according to an embodiment.

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will also be understood that when a layer is referred to as being "on" another layer or substrate, it can be directly on the other layer or substrate, or intervening layers may also be present. The same reference numbers indicate the same components throughout the specification. In the attached figures, the thickness of layers and regions is exaggerated for clarity.

Although the terms "first", "second", etc. may be used herein to describe various elements, these elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
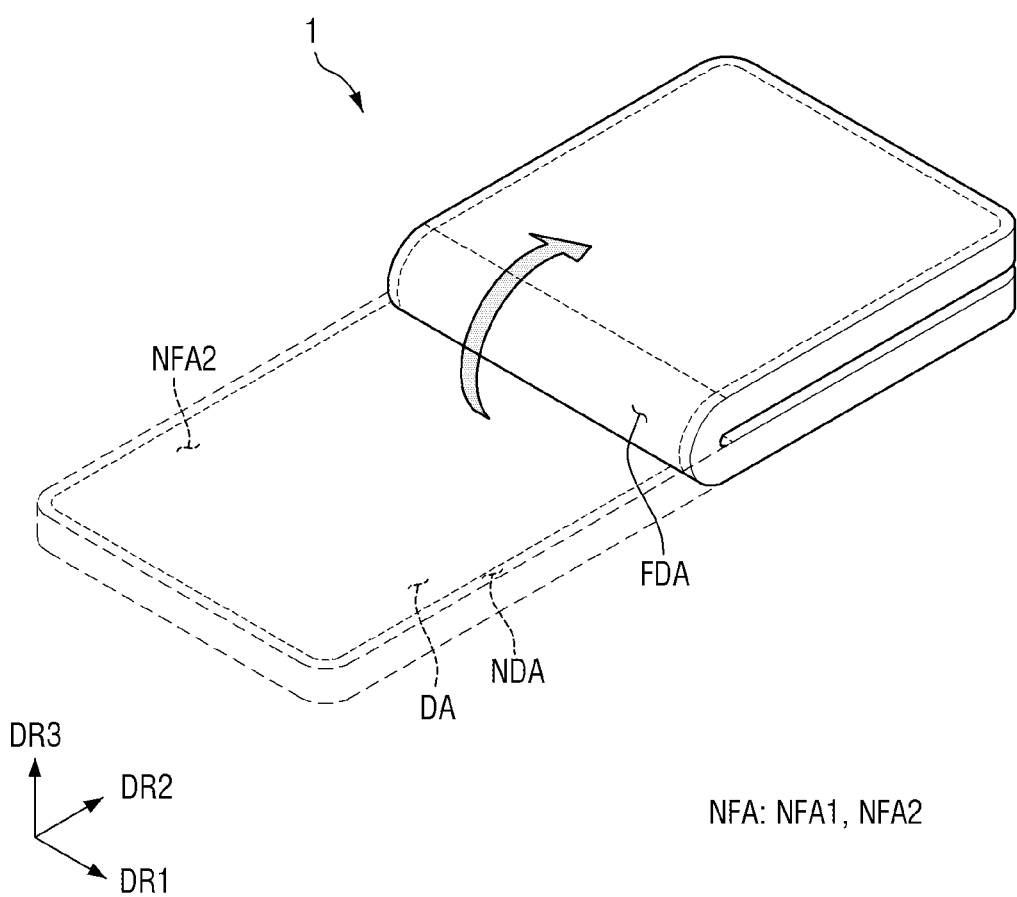
FIG. 2 is a perspective view illustrating a display device in a folded state according to an embodiment.

FIG. 1 is a perspective view illustrating a display device in an unfolded state according to an embodiment. FIG. 2 is a perspective view illustrating a display device in a folded state according to an embodiment. FIG. 2 shows an embodiment of a display device 1 in an in-folded state.

Referring to FIGS. 1 and 2, an embodiment of the display device 1 displays a screen or an image through a display area DA to be described later, and various devices including the display area DA may be included therein. In one embodiment, for example, the display device 1 may be applied to a smartphone, a mobile phone, a tablet personal computer ("PC"), a personal digital assistant ("PDA"), a portable multimedia player ("PMP"), a television, a game machine, a wristwatch-type electronic device, a head-mounted display, a monitor of a personal computer, a laptop computer, a car navigation system, a car's dashboard, a digital camera, a camcorder, an external billboard, an electronic billboard, a medical device, an inspection device, various household appliances such as a refrigerator and a washing machine, or an Internet-of-Things device.

The display device 1 may be a light emitting display device such as an organic light emitting display device using an organic light emitting diode, a quantum dot light emitting display device including a quantum dot light emitting layer, an inorganic light emitting display device including an inorganic semiconductor, or a micro light emitting display device using a micro light emitting diode ("LED"). Hereinafter, for convenience of description, embodiments where the display device 1 is an organic light emitting display device will be described in detail, but the disclosure is not limited thereto. In alternative embodiments, the display device 1 may be another type of display device such as a liquid crystal display device, a quantum dot liquid crystal display device, a quantum nano light emitting display panel ("nano NED"), a micro LED, or the like, for example.

In an embodiment, the display device 1 includes a display area DA and a non-display area NDA. The display area DA may display an image thereon or define a screen. The display area DA may include a plurality of pixels. The plurality of pixels may be arranged in a matrix form. The non-display area NDA may be an area where no image is displayed. In an embodiment where the display device 1 has a touch function, the display device 1 may include a touch area (not shown) where a touch input is detected, and the touch area (not shown) may overlap the display area DA. The touch area (not shown) may be substantially the same as the display area DA, but not being limited thereto.

The shape of the display area DA may correspond to the shape of the display device 1 in which the display area DA is defined. The display area DA may have a rectangular shape with right-angled or rounded corners in a plan view. However, the planar shape of the display area DA is not limited to the rectangular shape illustrated in the drawing, but may be a circular shape, an elliptical shape, or any other shape.

In an embodiment, as shown in FIGS. 1 and 2, the short side of the rectangle of the display area DA extends along a first direction DR1 and the long side thereof extends along a second direction DR2 perpendicular to the first direction DR1 is illustrated. A third direction DR3 is perpendicular to each of the first direction DR1 and the second direction DR2, and may refer to a thickness direction of the display device 1. It will be understood, however, that a direction mentioned herein refers to a relative direction and embodiments are not limited to the direction mentioned.

The non-display area NDA may surround the display area DA. In an embodiment, as shown in FIG. 1, the non-display area NDA may surround all sides of the display area DA, but the disclosure is not limited thereto. Alternatively, the non-display area NDA may not be disposed in the vicinity of at least a part of the four sides of the display area DA. A bezel area of the display device 1 may be configured as the non-display area NDA.

The display device 1 may be a foldable display device. As used herein, the term "foldable display device" refers to a display device which can be folded and may have both in a folded state and an unfolded state. Further, the folding typically includes folding at an angle of about 180 degrees. However, the disclosure is not limited thereto, and the folding may include a case where the folding angle exceeds 180 degrees or is less than 180 degrees, for example, a case where the folding angle is equal to or greater than 90 degrees and less than 180 degrees, or a case where the folding angle is equal to or greater than 120 degrees and less than 180 degrees. In addition, it may be referred to as a folded state if folding is performed out of the unfolded state, even if complete folding is not performed. For example, even if it is folded at an angle of 90 degrees or less, as long as the maximum folding angle becomes 90 degrees or more, it may be expressed as being in a folded state to distinguish it from the unfolded state.

The display device 1 may include a folding area FDA (or folding line). The display device 1 may be folded with respect to the folding area FDA. The folding may be classified into in-folding in which the display surface of the display device 1 is folded inward and out-folding in which the display surface of the display device 1 is folded outward. FIG. 2 illustrates an embodiment where the display device 1 is in-folded, but the disclosure is not limited thereto. In an embodiment, the display device 1 may be folded in an out-folding manner.

In an embodiment, the display device 1 may be folded in only one manner, i.e., an in-folding manner or out-folding manner. Alternatively, both the in-folding and the out-folding may be performed. In an embodiment of the display device in which both in-folding and out-folding are performed, in-folding and out-folding may be performed with respect to a same folding area FDA. Alternatively, the display device may include a plurality of folding areas, such as a folding area for in-folding only and a folding area for out-folding only, which are used to perform different types of folding from each other.

The folding area FDA may extend in a direction parallel to one side of the display device 1. In one embodiment, for example, the folding area FDA may extend in the extension direction (first direction DR1) of the short side of the display device 1. In an embodiment of the display device 1 having a rectangular shape in which the side extending in the second direction DR2 is longer than the side extending in the first direction DR1, the display device 1 includes the folding area FDA extending in the first direction DR1, the long side (side extending in the second direction DR2) of the display device 1 may be reduced to a half or less after a folding operation, whereas the short side (side extending in the first direction DR1) may be maintained. In an alternative embodiment, the folding area FDA may extend in a same direction (second direction DR2) as the extension direction of the long side (side extending in the second direction DR2).

The folding area FDA may also have a predetermined width in the second direction DR2. The width of the folding area FDA in the second direction DR2 may be much smaller than the width in the first direction DR1.

The display device 1 may include a non-folding area NFA disposed around the folding area FDA. The non-folding area NFA may include a first non-folding area NFA1 located on one side of the folding area FDA in the second direction DR2 and a second non-folding area NFA2 located on the other side of the folding area FDA in the second direction DR2. The widths of the first non-folding area NFA1 and the second non-folding area NFA2 in the second direction DR2 may be equal to each other, but the disclosure is not limited thereto. In an alternative embodiment, the width of the first non-folding area NFA1 in the second direction DR2 and the width of the second non-folding area NFA2 in the second direction DR2 may be different from each other according to the position of the folding area FDA.

The display area DA/non-display area NDA and the folding area FDA/non-folding area NFA of the display device 1 described above may overlap each other. In one embodiment, for example, a specific position may be located in the display area DA and also located in the first non-folding area NFA1. In such an embodiment, another specific position may be located in the non-display area NDA and also located in the first non-folding area NFA1. In such an embodiment, yet another specific position may be located in the display area DA and also located in the folding area FDA.

In an embodiment, the display area DA may be disposed over both the first non-folding area NFA1 and the second non-folding area NFA2. In such an embodiment, the display area DA may be located even in the folding area FDA corresponding to a boundary between the first non-folding area NFA1 and the second non-folding area NFA2. In such an embodiment, the display area DA of the display device 1 may be continuously arranged irrespective of boundaries of the non-folding area NFA, the folding area FDA and the like. However, the disclosure is not limited thereto. In an alternative embodiment, the display area DA may be located in only one of the first non-folding area NFA1 and the second non-folding area NFA2. In an alternative embodiment, the display area DA may be disposed in the first non-folding area NFA1 and the second non-folding area NFA2, but the display area DA may not be disposed in the folding area FDA.

Figure 3:
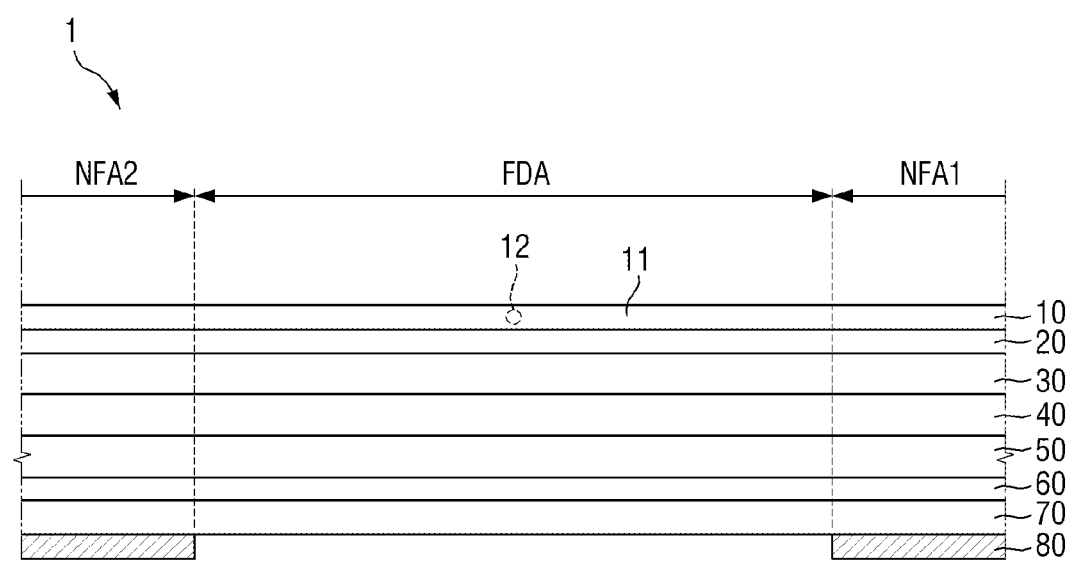
FIG. 3 is a cross-sectional view of a display device in an unfolded state according to an embodiment.
Figure 4:
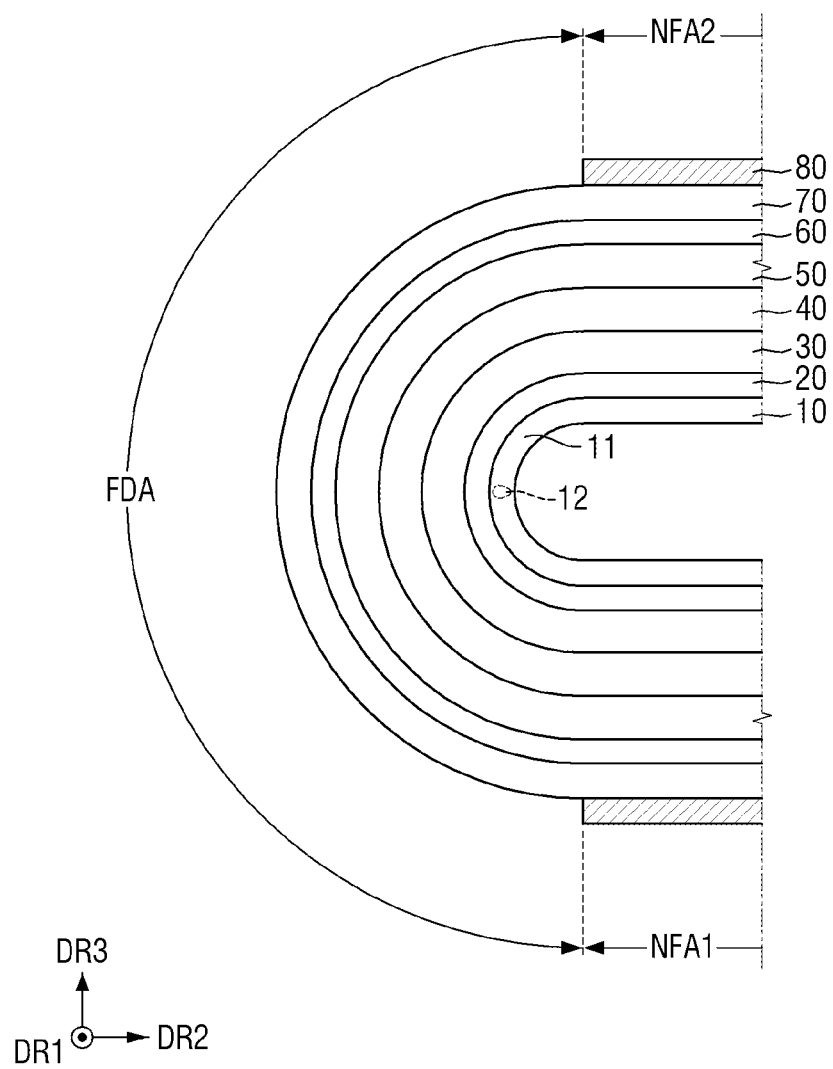
FIG. 4 is a cross-sectional view of a display device in an in-folded state according to an embodiment.

FIG. 3 is a cross-sectional view of a display device in an unfolded state according to an embodiment. FIG. 4 is a cross-sectional view of a display device in an in-folded state according to an embodiment.

Referring to FIGS. 3 and 4, an embodiment of the display device 1 may include a protective film 10, and a cover window 20, an impact absorbing layer 30, an anti-reflection member 40, a display panel 50, a polymer film layer 60, a cushion layer 70, and a heat dissipation member 80 that are sequentially stacked on one side of the protective film 10 in the thickness direction (the third direction DR3). Although not shown, at least one bonding member such as an adhesive layer or a tackifying layer may be disposed between the stacked members to bond the adjacent stacked members to each other.

The protective film 10 serves to protect the cover window 20 disposed therebelow. In an embodiment, the protective film 10 may perform at least one selected from functions of prevention of scattering, impact absorption, prevention of scratch, prevention of fingerprint smudges and prevention of glare on the cover window 20.

The protective film 10 may include a transparent polymer film. The transparent polymer film may include, for example, at least one selected from polyethylene terephthalate ("PET"), polyethylene naphthalate ("PEN"), polycarbonate ("PC"), polymethyl methacrylate ("PMMA"), polystyrene, polyvinylchloride, polyethersulfone ("PES"), polyethylene, polypropylene ("PP"), and a combination thereof.

The protective film 10 may include a first region 11 and a second region 12 having different modulus values from each other, which will be described later in detail.

The cover window 20 may be disposed below the protective film 10. The cover window 20 serves to cover and protect the members stacked therebelow. The cover window 20 may include or be made of a transparent material. The cover window 20 may include, for example, glass or plastic.

In an embodiment where the cover window 20 includes plastic, the plastic may be, for example, polyimide, but is not limited thereto. In an embodiment where the cover window 20 includes glass, the glass may be, for example, ultra-thin glass ("UTG") or thin glass. The cover window 20 may have a flexible property such that the cover window 20 may be twisted, bent, folded, or rolled.

The impact absorbing layer 30 may be disposed below the cover window 20. The impact absorbing layer 30 may serve to increase the durability of the cover window 20 and improve the optical performance. The impact absorbing layer 30 may be optically transparent. Alternatively, the impact absorbing layer 30 may be omitted.

The anti-reflection member 40 may be disposed below the impact absorbing layer 30. The anti-reflection member 40 may serve to reduce the reflection of external light. In an embodiment, the anti-reflection member 40 may in a form of a polarizing film. In such an embodiment, the anti-reflection member 40 polarizes light passing therethrough. The disclosure is not limited thereto, and the anti-reflection member 40 may be provided as a color filter layer in the display panel 50.

The display panel 50 may be disposed below the anti-reflection member 40. The display panel 50 may display a screen or an image. The display panel 50 may include at least one thin film transistor ("TFT") and a light emitting element that is electrically connected to the thin film transistor to emit light. The display panel 50, which is a panel for displaying an image, may include an organic light emitting display panel. Herein, for convenience of description, embodiments where the display panel 50 is an organic light emitting display panel are describe in detail, but the disclosure is not limited thereto. The above-mentioned display panels or other display panels known in the relevant field may be applied within the scope of the teachings herein.

The polymer film layer 60 may be disposed below the display panel 50. The polymer film layer 60 may include, for example, polyimide (PI), PET, PC, polyethylene ("PE"), PP) polysulfone ("PSF"), PMMA, triacetylcellulose ("TAC"), cycloolefin polymer ("COP") or the like. The polymer film layer 60 may include a functional layer in at least one surface thereof. The functional layer may include, for example, a light absorbing layer. The light absorbing layer may include a light absorbing material such as a black pigment or dye. The light absorbing layer may be formed by coating or printing black ink on a polymer film.

The cushion layer 70 may be disposed below the polymer film layer 60. The cushion layer 70 may serve to increase the durability against impact that may be applied in the thickness direction (third direction DR3) of the display device 1 and to reduce drop impact that occurs when the display device 1 is dropped. The cushion layer 70 may include polyurethane or the like.

The heat dissipation member 80 may be disposed below the cushion layer 70. The heat dissipation member 80 serves to diffuse heat generated from the display panel 50 or other components of the display device 1. The heat dissipation member 80 may include a metal plate. The metal plate may include metal having high thermal conductivity, such as copper and silver. The heat dissipation member 80 may include a heat dissipation sheet including graphite, carbon nanotubes or the like.

In an embodiment, some layers of the display device 1 may be separated by the folding area FDA to facilitate the folding of the display device 1. In one embodiment, for example, the heat dissipation member 80 constituting the lowermost layer of the display device 1 and having low ductility may be separated by the folding area FDA.

In an alternative embodiment, the cushion layer 70 or the polymer film layer 60 may also be separated by the folding area FDA. In an embodiment, where the cushion layer 70 or the polymer film layer 60 has sufficient ductility or flexibility, the cushion layer 70 or the polymer film layer 60 may have an integrally connected shape regardless of the folding area FDA and the non-folding area NFA.

When the display device 1 is in-folded with respect to the folding area FDA, the second non-folding area NFA2 may overlap the first non-folding area NFA1 in the thickness direction as shown in FIG. 4. In such an embodiment, the protective film 10, the cover window 20, and the like may be bent to form a curved cross section along a width direction (second direction DR2) of the folding area FDA.

The protective film 10 needs to have a certain level of impact resistance (or hardness) to protect the cover window disposed therebelow and a certain level of flexibility to be bent to form a curved cross section in the folding area FDA. In such an embodiment, both the impact resistance in the entire protective film 10 and the flexibility in the folding area FDA may be ensured by changing the physical property of a partial region (e.g., the second region 12, see FIGS. 5 and 6) of the protective film 10 by laser radiation or the like, which will hereinafter be described in detail with reference to FIGS. 5 and 6.

Figure 5:
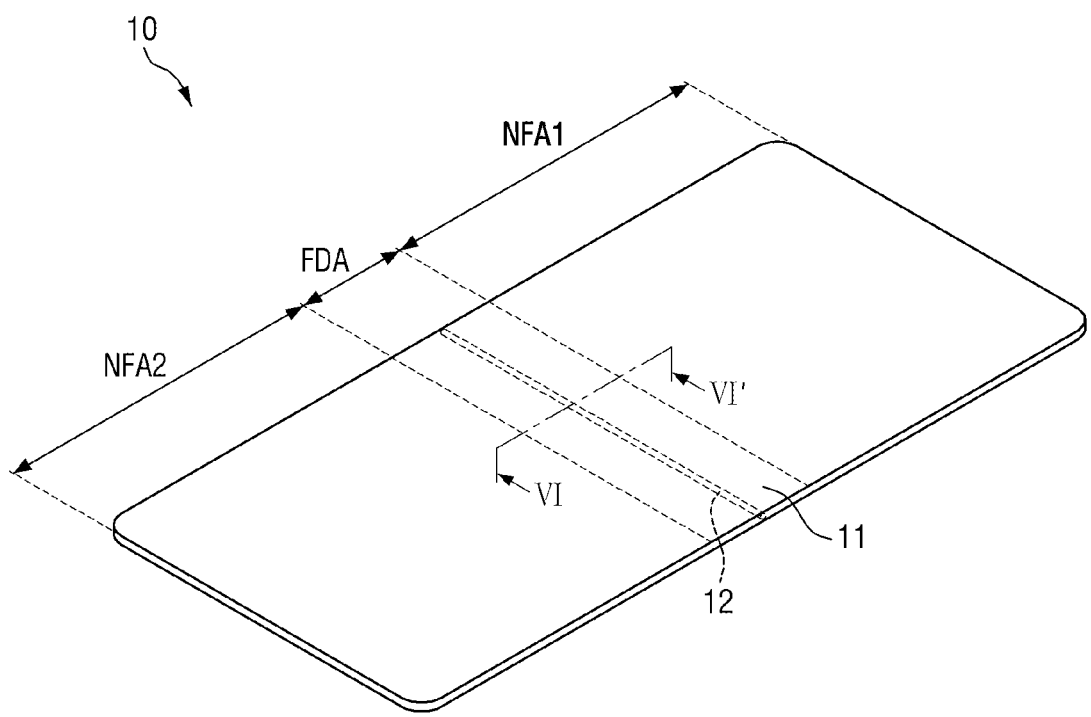
FIG. 5 is a perspective view of a protective film according to an embodiment.
Figure 6:
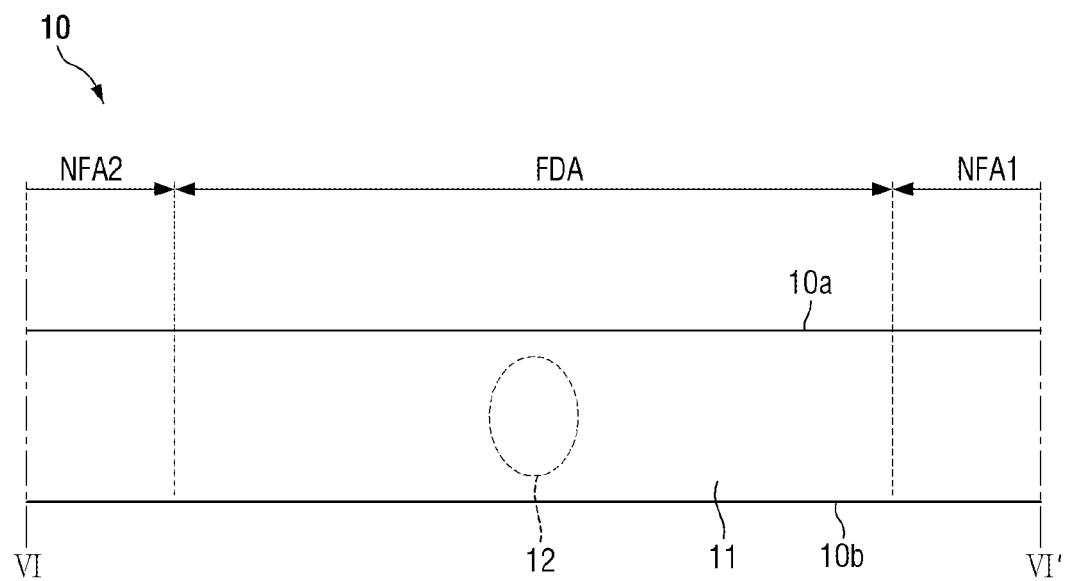
FIG. 6 is a cross-sectional view taken along line VI-VI' of FIG. 5.
Figure 6:
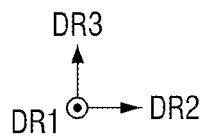

FIG. 5 is a perspective view of a protective film according to an embodiment. FIG. 6 is a cross-sectional view taken along line VI-VI' of FIG. 5. FIG. 6 shows a same component as the protective film 10 shown in FIG. 3, but is an enlarged view of a partial region (around the second region 12) for simplicity of description.

Referring to FIGS. 5 and 6, an embodiment of the protective film 10 may include a first surface 10*a* (or a top surface) and a second surface 10*b* (or a bottom surface) opposite thereto, which face each other. The first surface 10*a* and the second surface 10*b* of the protective film 10 may be flat. In such an embodiment, the first surface 10*a* and the second surface 10*b* of the protective film 10 may be disposed over the folding area FDA and the non-folding areas NFA1 and NFA2, and may be arranged on substantially a same plane in an unfolded state.

The protective film 10 may include the first region 11 and the second region 12, which include a same material as each other and have different physical properties from each other. The first region 11 and the second region 12 may include or be made of a same material, e.g., a material of a transparent polymer film of the protective film 10.

The protective film 10 may include a region where there is no physical interface between the first region 11 and the second region 12. In such an embodiment, at least a part of the region between the first region 11 and the second region 12 may have no physical boundary. In this specification, "there is no or substantially no physical boundary between two components" means that there is no physical interface that can physically partition the two components. The first region 11 and the second region 12 may be connected to each other and integrally formed as a single unitary unit.

The first region 11 may be defined by most portions of the protective film 10. The first region 11 may be disposed over the folding area FDA and the non-folding area NFA (NFA1 and NFA2). The second region 12 may be disposed in the folding area FDA. The second region 12 may extend in substantially the same direction as the extension direction (first direction DR1) of the folding area FDA. In one embodiment, for example, where the folding area FDA extends in the first direction DR1, the second region 12 may extend in the first direction DR1.

The first region 11 may surround the second region 12 in a cross-sectional view. The first region 11 may cover one side and the other side of the second region 12 in the thickness direction (the third direction DR3) and may cover one side and the other side in the second direction DR2. In such an embodiment, a first surface and the a second surface of the first region 11 may be substantially the same as the first surface 10a and the second surface 10b of the protective film 10, respectively. Therefore, the first surface and the second surface of the first region 11 may be labeled with the same or like reference numerals as used to indicate the first surface 10a and the second surface 10b of the protective film 10. The first surface 10a and the second surface 10b of the first region 11 may be disposed over the folding area FDA and the non-folding areas NFA1 and NFA2, and may be substantially parallel to each other.

The entire first region 11 may be filled with a same material. In such an embodiment, the entire first region 11 may be filled with a uniform medium. Since the second region 12 is surrounded by the first region 11 in cross-sectional view and the entire first region 11 is filled with a uniform medium, the second region 12 may be surrounded by a same material.

However, the disclosure is not limited thereto, and the first region 11 may cover at least one selected from one side and the other side of the second region 12 in the thickness direction (third direction DR3) or at least one selected from one side and the other side of the second region 12 in the second direction DR2. In such an embodiment, the second region 12 may be exposed to the outside in at least one of one side and the other side in the thickness direction (the third direction DR3) or one side and the other side in the second direction DR2.

In an embodiment, the second region 12 may generally have an elliptical shape in cross sectional view. In such an embodiment, the width of the second region 12 in the thickness direction (third direction DR3) may be greater than the width of the second region 12 in the second direction DR2 in cross-sectional view. However, the shape of the second region 12 is not limited thereto, and the second region 12 may have one of other various shapes such as a circular shape and the like.

The second region 12 may be substantially a same as or defined by the region where heat is diffused due to the influence of the thermal energy generated by laser radiation to be described later. In such an embodiment, a laser may be radiated to a focus FC (see FIG. 9) in a partial region of the protective film 10, and the physical property of the partial region of the protective film 10 to which the laser is radiated may be changed. In such an embodiment, the change in the physical property may be caused by the change in a structure such as an atomic arrangement structure, a molecular arrangement structure, or the like in the partial region due to the laser. In one embodiment, for example, the second region 12 may be a region formed by melting a part of the protective film 10 by heat and solidifying the melted part.

The second region 12 is not limited thereto, and may further include a plasma structure. In such an embodiment, the plasma structure may be formed in a shape having a long axis and a short axis intersecting each other. The plasma structure may have various sizes. However, the disclosure is not limited thereto, and the plasma structure may not exist or may not be visually recognized even though the plasma structure exists.

In an embodiment where the second region 12 includes the plasma structure, the plasma structure and the peripheral region of the plasma structure disposed in the second region 12 may be melted at different temperatures and then solidified. Accordingly, the plasma structure and the peripheral region of the plasma structure may have different optical features or properties from each other, and thus may be visually recognized.

The first region 11 and the second region 12 may have different densities from each other. The density of the first region 11 may mean the average density of the entire first region 11, and the density of the second region 12 may mean the average density of the entire second region 12. The densities of the first region 11 and the second region 12 may be calculated by measuring weight per unit volume.

The density of the first region 11 may be higher than the density of the second region 12. In one embodiment, for example, the density of the first region 11 may be in a range of about 1.15 times to about 1.28 times or in a range of about 1.05 times to about 1.5 times of the density of the second region 12, but not being limited thereto.

In an embodiment, the density of the first region 11 may be in a range of about 1.3 grams per cube centimeters (g/cm$^3$) to about 1.5 g/cm$^3$ or in a range of about 1.0 g/cm$^3$ to about 1.8 g/cm$^3$. In one embodiment, for example, the density of the first region 11 may be about 1.4 g/cm$^3$. In an embodiment, the density of the second region 12 may be in a range of about 1.1 g/cm$^3$ to about 1.2 g/cm$^3$, in a range of about 0.9 g/cm$^3$ to about 1.3 g/cm$^3$, or in a range of about 0.7 g/cm$^3$ to about 1.6 g/cm$^3$. In one embodiment, for example, the density of the second region 12 may be about 1.2 g/cm$^3$.

The first region 11 and the second region 12 may have different light transmittances from each other. The light transmittance of the first region 11 and the light transmittance of the second region 12 may mean the average light transmittance in the respective regions.

The light transmittance of the first region 11 may be higher than the light transmittance of the second region 12. In an embodiment, the light transmittance of the first region 11 may be in a range of about 1.01 times to about 1.1 times of the light transmittance of the second region 12, or in a range of about 1.01 times to about 1.5 times of the light transmittance of the second region 12.

The light transmittance of the first region 11 may be in a range of about 94% to about 96% or in a range of about 92% to about 99%, for example, but not being limited thereto. The light transmittance of the second region 12 may be in a range of about 92% to about 94% or in a range of about 90% to about 97%, for example, but not being limited thereto.

The first region 11 and the second region 12 may have different modulus values from each other. The modulus value of the first region 11 may mean the average modulus value of the first region 11, and the modulus value of the second region 12 may mean the average modulus value of the second region 12.

The modulus value of the first region 11 may be greater the modulus value of the second region 12. In one embodiment, for example, the modulus value of the first region 11 may be in a range of about 3 times to about 3.5 times of the modulus value of the second region 12, or may be in a range of about 2 times to about 7 times of the modulus value of the second region 12, but not being limited thereto.

In an embodiment, the modulus value of the first region 11 may be in a range of about 6 gigapascals (GPa) to about 7 GPa or in a range of about 3 GPa to about 10 GPa. In one embodiment, for example, the modulus value of the first region 11 may be about 6.5 GPa. In an embodiment, the modulus value of the second region 12 may be in a range of about 1.5 GPa to about 2.5 GPa, in a range of about 1 GPa to about 4 GPa, or in a range of about 0.5 GPa to about 5 GPa. In one embodiment, for example, the modulus value of the second region 12 may be about 2 GPa, for example.

In such an embodiment, the first region 11 and the second region 12 have different modulus values from each other, such that the protective film 10 may have both impact resistance and flexibility. This will hereinafter be described in detail with further reference to FIG. 7.

Figure 7:
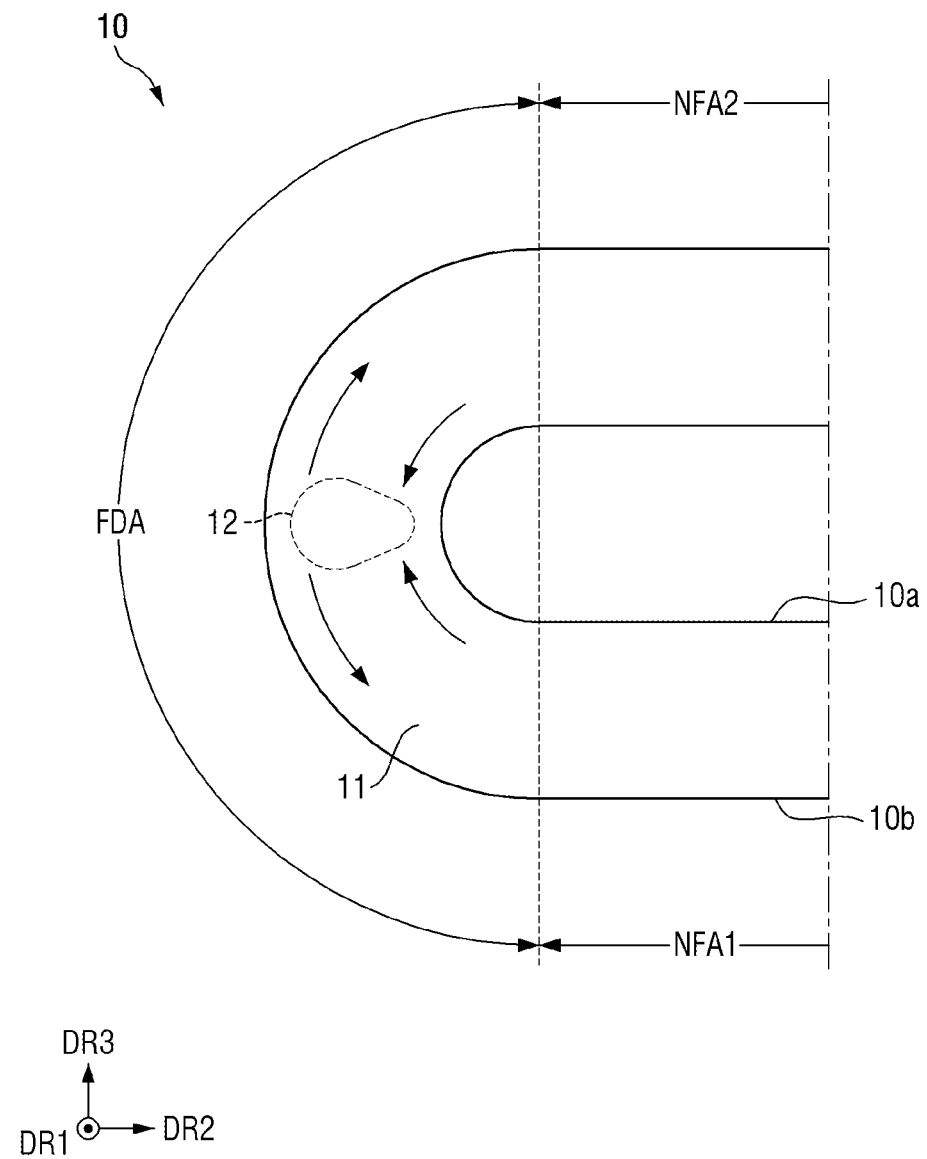
FIG. 7 is a cross-sectional view showing an in-folded state of the protective film of FIG. 6.

FIG. 7 is a cross-sectional view showing an in-folded state of the protective film of FIG. 6. FIG. 7 shows the state in which the protective film 10 is folded when the display device 1 is in-folded as shown in FIG. 2.

Referring further to FIG. 7, when the protective film 10 is folded, different stresses may be applied to the folding area FDA of the protective film 10. In an embodiment, when the protective film 10 is folded, compressive stress may be applied to a portion of the folding area FDA closer to the first surface 10a of the protective film 10 and tensile stress may be applied to a portion of the folding area FDA closer to the second surface 10b of the protective film 10. The compressive stress may be maximized on the first surface 10a of the protective film 10 and may decrease toward the second surface 10b side. The tensile stress may be maximized on the second surface 10b of the protective film 10 and may decrease toward the first surface 10a side.

The modulus may be related to the deformation or the restoration due to the pressure applied to the protective film 10. The modulus is expressed as a ratio of stress to strain, and a smaller modulus indicates easier deformation at a same stress level. The protective film 10 includes the first region 11 and the second region 12 having different modulus values from each other. In such an embodiment, the second region 12 having a relatively small modulus value is disposed in the folding area FDA, such that the protective film 10 may be folded more easily.

In an embodiment, where the second region 12 disposed in the folding area FDA of the protective film 10 has a smaller modulus value than the modulus value of the first region 11, when the protective film 10 is folded, the second region 12 disposed in the folding area FDA may be deformed more at a same stress level, so that the folding area FDA of the protective film 10 may be folded more easily. Therefore, in such an embodiment, the occurrence of defects and the like caused by the stress applied during the folding operation may be substantially suppressed or effectively prevented.

In an embodiment, the first region 11 of the protective film 10 has sufficient impact resistance, such that the protective film 10 may have sufficient impact resistance because the first region 11 occupies most of the protective film 10. In such an embodiment, since the second region 12 of the protective film 10 disposed in the folding area FDA has a smaller modulus value than the modulus value of the first region 11, sufficient flexibility of the protective film 10 may be ensured to allow the protective film 10 to be folded more easily.

In such an embodiment, since the first region 11 and the second region 12 are formed substantially integrally and have different modulus values from each other, sufficient impact resistance in the entire protective film 10 and sufficient flexibility in the folding area FDA may be ensured. In such an embodiment, as will be described later, a laser may be used to change the physical property of a specific region (e.g., the second region 12) of the protective film 10. Accordingly, the processing efficiency may be improved. This will be described in greater detail later.

The modulus value of the first region 11 and the modulus value of the second region 12 of the protective film 10 may be values measured in a state of being extracted from the protective film 10 of the display device 1 (see FIG. 1) after having been included therein. The modulus value of the first region 11 and the modulus value of the second region 12 may be measured by an indenter, such as a bio-indenter or a nano-indenter, for example, made by the company Anton-Paar GmbH. In such an embodiment, the modulus of the first region 11 and the modulus of the second region 12 of the protective film 10 may be measured by an indenter evaluation method.

The first region 11 and the second region 12 of the protective film 10 may have different creep properties from each other. If the creep property is less than 30%, the deformation may be incomplete in the folding operation, and if the creep property exceeds 70%, the restoration force may be insufficient. The creep properties of the respective regions may be in inverse proportion to the modulus value. In an embodiment, the modulus value of the first region 11 is smaller than the modulus value of the second region 12, such that the creep property of the first region 11 may be lower than the creep property of the second region 12.

In one embodiment, for example, the creep property of the first region 11 may be in a range of about 40% to about 50% or in a range of about 30% to about 60%, and the creep property of the second region 12 may be in a range of about 60% to about 70% or in a range of about 50% to about 70%, but not being limited thereto. The above-described creep properties may also be measured by the indenter, and the measured creep property of the protective film 10 in a thin film state or in a separated state from the display device 1 (see FIG. 1) may be in the above-described range of about 30% to about 70%.

Hereinafter, a method of manufacturing a display device according to an embodiment will be described in detail.

Figure 8:
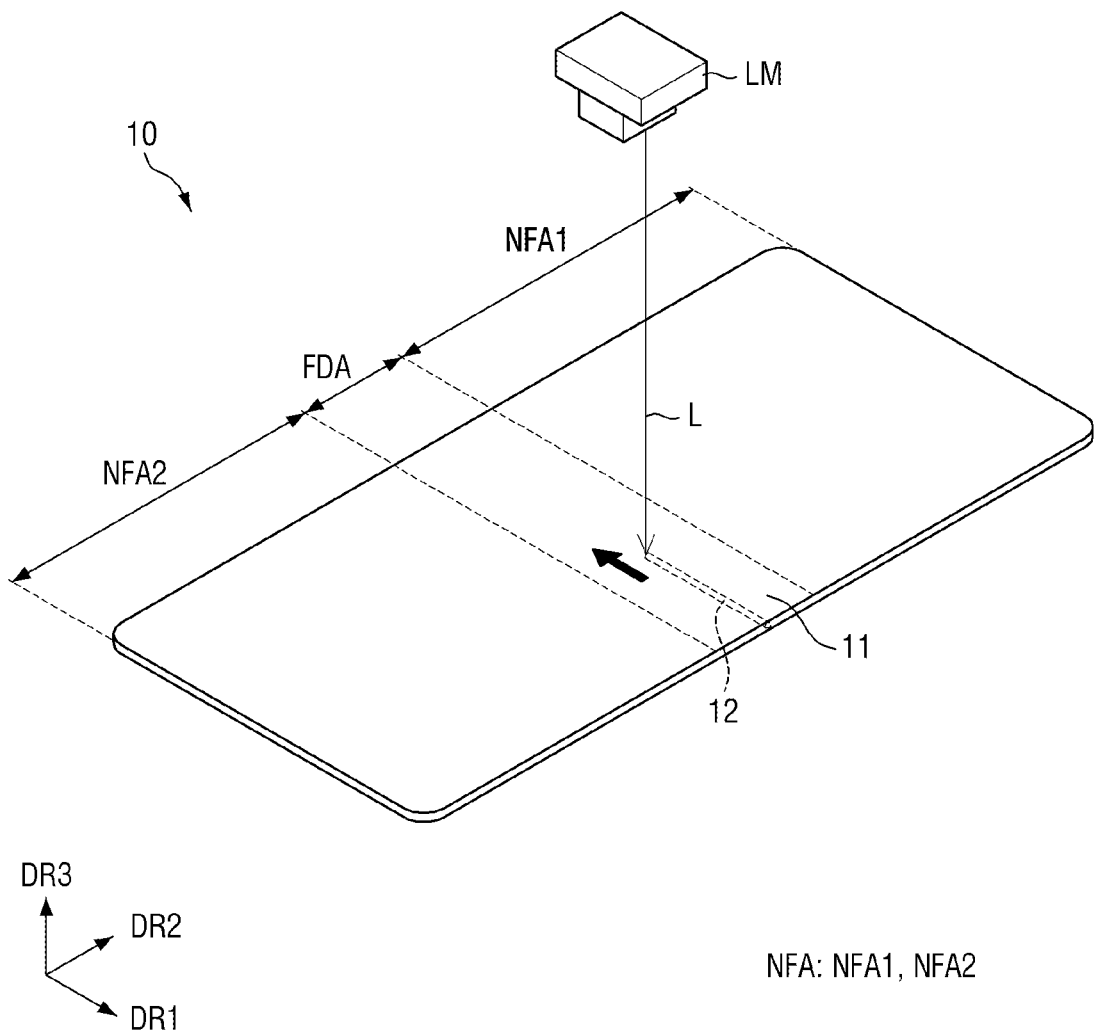
FIG. 8 is a perspective view showing a method of manufacturing a display device according to an embodiment.
Figure 9:
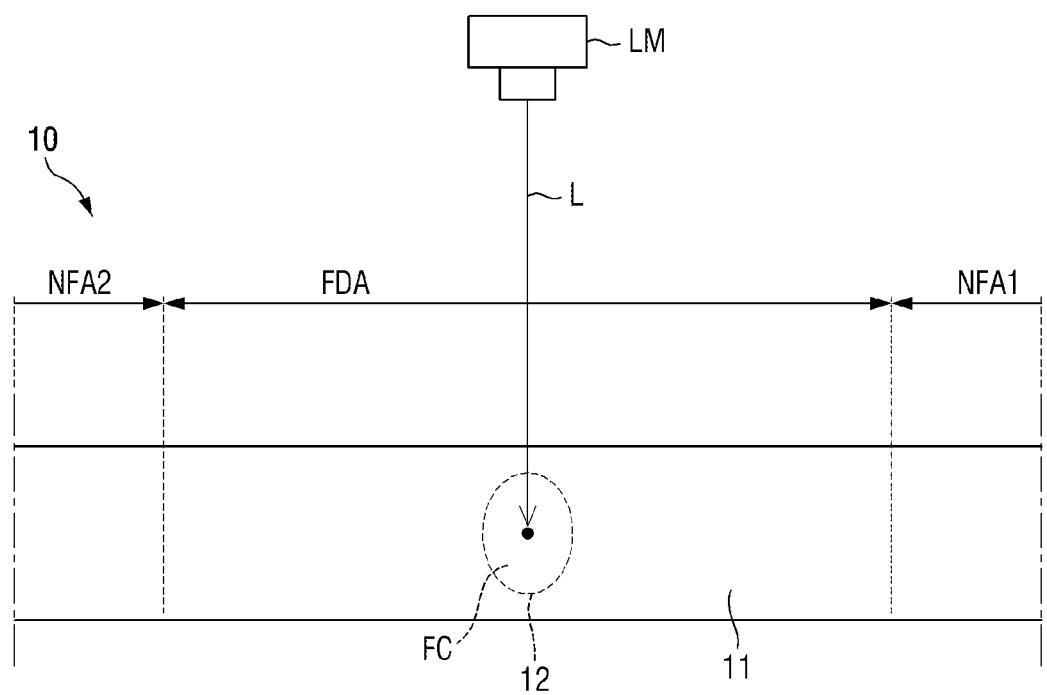
FIG. 9 is a cross-sectional view showing a method of manufacturing a display device according to an embodiment.
Figure 10:
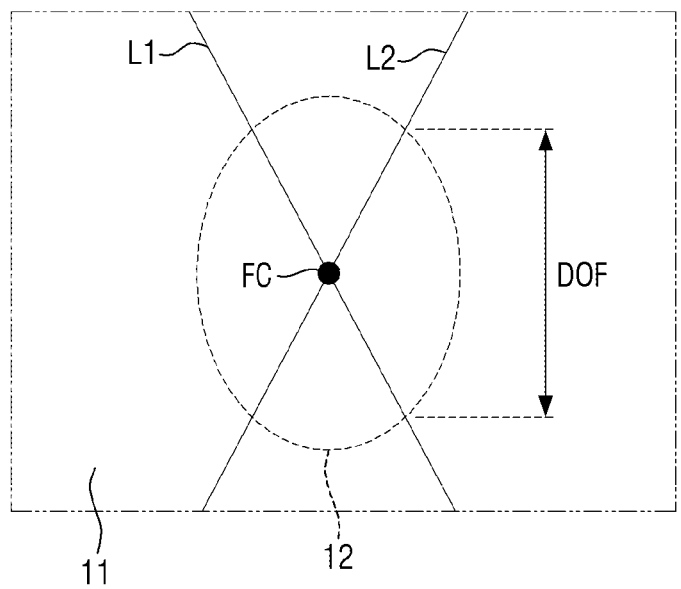
FIG. 10 is an enlarged view of an area around the focus of FIG. 9.

FIG. 8 is a perspective view showing a method of manufacturing a display device according to an embodiment. FIG. 9 is a cross-sectional view showing a method of manufacturing a display device according to an embodiment. FIG. 10 is an enlarged view of an area around the focus of FIG. 9. FIG. 10 shows the focus FC and an effective depth of focus DOF around the focus FC.

Referring to FIGS. 8 to 10, in an embodiment of a method of manufacturing a display device, the second region 12 of the protective film 10 may be formed by a laser L emitted from a laser module LM.

The laser module LM capable of emitting the laser L may be disposed above the protective film 10. The laser module LM may be disposed above the protective film 10 to be spaced apart from the protective film 10. The laser module LM may emit the laser L toward the protective film 10.

The laser L may include a plurality of lights L1 and L2 and may include the focus FC where the lights L1 and L2 are concentrated and the effective depth of focus DOF. The focus FC of the laser L may be disposed in the protective film 10 and may be disposed in the folding area FDA. The effective depth of focus DOF may be disposed around the focus FC. The effective depth of focus DOF may be disposed in the second region 12 and may be disposed in the folding area FDA. The physical property may be changed around the focus FC and the effective depth of focus DOF of the laser L.

In an embodiment, the laser module LM may emit a femtosecond laser (or microwave laser). In such an embodiment, the laser L may be the femtosecond laser. Hereinafter, for convenience of description, embodiments where the laser module LM emits the femtosecond laser will be described in detail. However, the disclosure is not limited thereto, and alternatively, the laser module LM may emit a picosecond laser or a nanosecond laser. In an embodiment, when the laser L is radiated to the focus FC located in the protective film 10, high energy may be provided to the area around the focus FC or the effective depth of focus DOF. Accordingly, heat may be generated from the focus FC or the effective depth of focus DOF, and thermal energy may be transferred toward the area around the focus FC or the effective depth of focus DOF. The area around the focus FC or the effective depth of focus DOF may be melted by the transferred thermal energy. Accordingly, the second region 12 of the protective film 10 may be formed. The second region 12 may be formed by re-solidifying the melted area. However, the disclosure is not limited thereto, and a part of the second region 12 may be maintained in the melted state.

In an embodiment, the second region 12 may include the plasma structure. In such an embodiment, the high energy provided to the focus FC by the laser L may convert a part of the protective film 10 into a plasma state. The part of the protective film 10 in a plasma state may be melted and grown in the radiation direction of the laser L to form the plasma structure.

In a process of melting and re-solidifying the area around of the focus FC, the atomic arrangement structure and the molecular arrangement structure in that area may be changed, and the physical property of the area around of the focus FC may be changed. In such an embodiment, the change in the physical property of the area (the second region 12) may be controlled or determined by adjusting the processing conditions of the laser L, and the change in the physical property is thereby adjusted. In such an embodiment, the position, the shape, and the size of the second region 12 may be adjusted by adjusting the processing conditions of the laser L. In one embodiment, for example, the effective depth of focus DOF may be adjusted by adjusting the wavelength of the laser L or the focal length of the lens included in the laser module LM. In such an embodiment, the physical property, the position, the shape, or the size of the melted and solidified second region 12 may be adjusted by adjusting the effective depth of focus DOF and the half width of the laser L. The laser module LM may emit the laser L while moving above the protective film 10 in the first direction DR1. Accordingly, the second region 12 extending in the first direction DR1 may be formed. In such an embodiment, the position, the planar shape, and the like of the second region 12 may be adjusted by adjusting the position, the moving direction, and the like of the laser module LM.

In such an embodiment, the physical property of the specific region (e.g., the second region 12) of the protective film 10 may be changed by emitting the laser L, such that the protective film 10 may have sufficient impact resistance and sufficient flexibility. In such an embodiment, the specific region (second region 12) may have a physical property different from the physical properties of other surrounding regions by radiating the laser L to the specific region (e.g., the second region 12) of the protective film 10.

In such an embodiment, since the physical property of the specific region (e.g., the second region 12) is changed by the laser L emitted from the laser module LM, an additional process for ensuring sufficient flexibility in the folding area FDA of the protective film 10 may be omitted. Accordingly, the processing efficiency may be improved. In such an embodiment, since the physical property of only the specific region (e.g., the second region 12) in one base member (e.g., the protective film 10) is changed, another member having a physical property different from the physical property of the base member to be combined with the base member may be omitted. Therefore, the processing cost may be reduced, and the reliability of the protective film 10 may be improved. In such an embodiment, the physical property of the specific region (e.g., the second region 12) may be changed by adjusting the focus FC of the laser L or the like regardless of the thickness of the protective film 10.

Hereinafter, other alternative embodiments of the display device will be described. Hereinafter, a description of the same components of such alternative embodiments as those of the above-described embodiments will be omitted or simplified, and differences will be mainly described.

Figure 11:
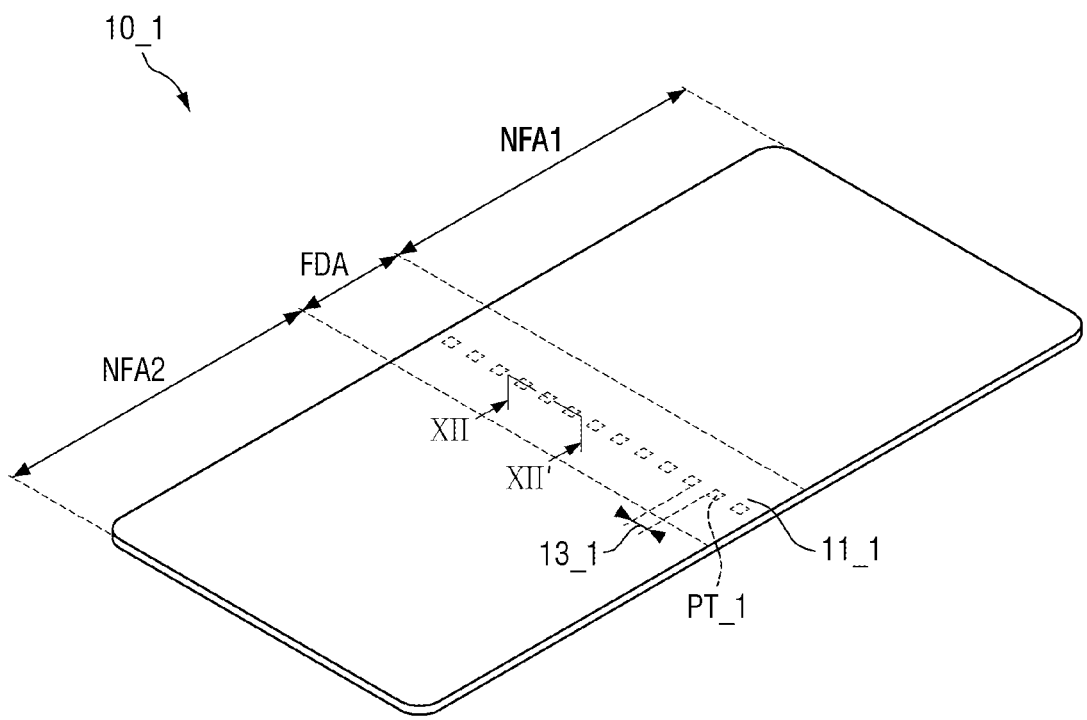
FIG. 11 is a perspective view of a protective film according to an alternative embodiment.
Figure 12:
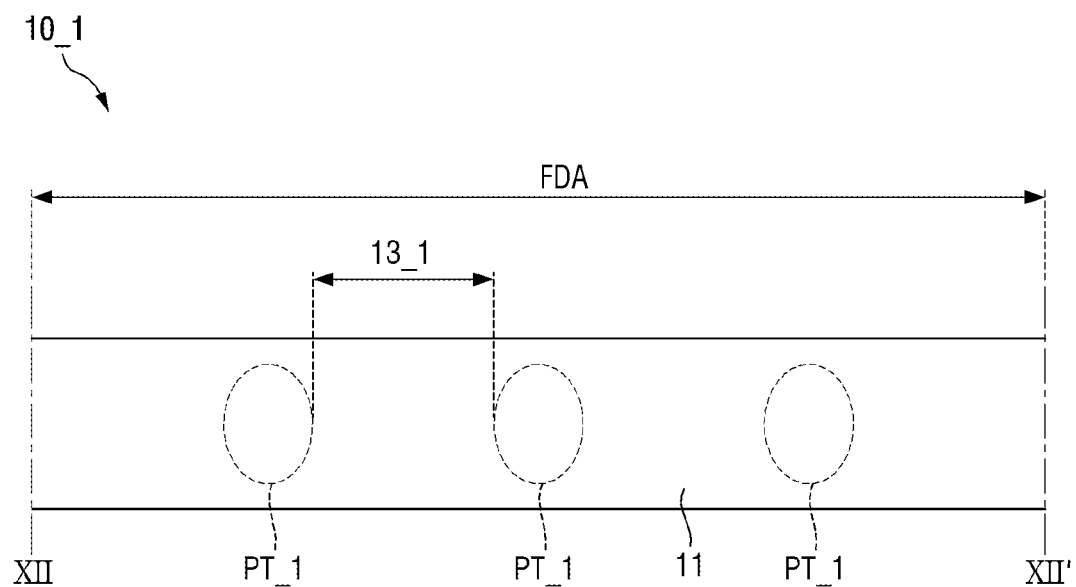
FIG. 12 is a cross-sectional view taken along line XII-XII' of FIG. 11.

FIG. 11 is a perspective view of a protective film according to an alternative embodiment. FIG. 12 is a cross-sectional view taken along line XII-XII' of FIG. 11. FIG. 12 is a cross-sectional view taken along a direction (the first direction DR1) in which multiple patterns PT_1 are arranged.

The embodiment shown in FIGS. 11 and 12 is substantially the same as the embodiment of FIG. 5 except that a second region 12_1 of a protective film 10_1 includes the multiple patterns PT_1 spaced apart from each other.

In an embodiment, as shown in FIG. 11, the second region 12_1 of the protective film 10_1 may include the multiple patterns PT_1 repeatedly arranged along the first direction DR1 while being spaced apart from each other. The multiple patterns PT_1 may be substantially the same as the second region 12 of FIGS. 5 to 7. In such an embodiment, while moving in the first direction DR1, the laser module LM (see FIG. 8) may not emit the laser L (see FIG. 8) to a part of the folding line FDA, and may emit the laser L (see FIG. 8) only to the remaining part of the folding line FDA to form the multiple patterns PT_1.

The cross-sectional shape of each of the patterns PT_1 may be substantially the same as the cross-sectional shape of the second region 12 described above with reference to FIG. 6. Although it is illustrated in the drawing that the cross-sectional shape of the pattern PT_1 is substantially the same as the cross-sectional shape of the second region 12 shown in FIG. 6, the disclosure is not limited thereto. In one embodiment, for example, in the cross-sectional view taken along the first direction DR1, the width of the patterns PT_1 in the first direction DR1 may be greater than the width of the second region 12 (see FIG. 6) in the second direction DR2.

In such an embodiment, the protective film 10_1 may include a plurality of third regions 13_1 arranged between the patterns PT_1 of the second region 12_1. The third regions 13_1 may be spaced apart from each other with the patterns PT_1 of the second region 12_1 interposed therebetween and may be repeatedly arranged along the first direction DR1. The third regions 13_1 may have physical properties different from the physical properties of a first region 11_1 and the second region 12_1.

In one embodiment, for example, the density of the third regions 13_1 may be lower than the density of the first region 11_1 and higher than the density of the second region 12_1, and the light transmittance of the third regions 13_1 may be lower than the light transmittance of the first region 11_1 and higher than the light transmittance of the second region 12_1. In such an embodiment, the modulus value of the third regions 13_1 may be smaller than the modulus value of the first region 11_1 and greater than the modulus value of the second region 12_1, and the creep properties of the third regions 13_1 may be higher than the creep property of the first region 11_1 and lower than the creep property of the second region 12_1.

The third regions 13_1 may be formed by local radiation of the laser L (see FIG. 5) while the laser module LM (see FIG. 5) that emits the laser L (see FIG. 5) to form the patterns PT_1 of the second region 12_1 is moving between the adjacent patterns PT_1. Therefore, the physical properties of the third regions 13_1 may be changed less than the physical property of the second region 12_1.

In such an embodiment, sufficient impact resistance in the entire protective film 10_1 and sufficient flexibility in the folding area FDA may be ensured, and the efficiency of the process of forming the protective film 10_1 may be improved. In such an embodiment, the impact resistance may be improved by arranging the third regions 13_1 between the patterns PT_1 of the second region 12_1.

Figure 13:
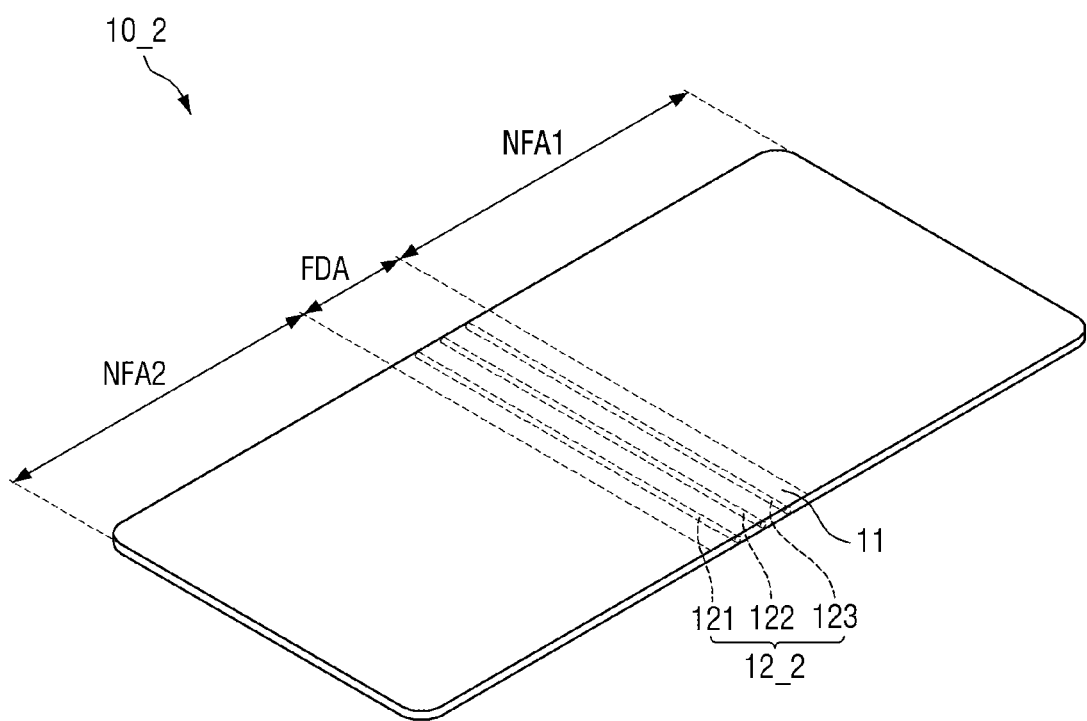
FIG. 13 is a perspective view of a protective film according to another alternative embodiment.

FIG. 13 is a perspective view of a protective film according to another alternative embodiment.

The embodiment shown in FIG. 13 is substantially the same as the embodiment of FIG. 5 except that a protective film 10_2 includes multiple second regions 12_2 (121, 122, and 123).

In such an embodiment, the protective film 10_2 may include the multiple second regions 12_2 (121, 122, and 123). The second regions 12_2 (121, 122, and 123) may be disposed in the folding area FDA and extend in a same direction (third direction DR1) as the extension direction (first direction DR1) of the folding area FDA. In such an embodiment, the second regions 12_2 (121, 122, and 123) may be repeatedly arranged along the second direction DR2 while being spaced apart from each other. In an embodiment, as shown in FIG. 13, the protective film 10_2 includes three second regions 12_2 (121, 122, and 123), but the disclosure is not limited thereto, and alternatively two second regions or four or more second regions may be provided.

In such an embodiment, sufficient impact resistance in the entire protective film 10_2 and sufficient flexibility in the folding area FDA may be ensured, and the efficiency of the process of forming the protective film 10_2 may be improved. In such an embodiment where the multiple second regions 12_2 (121, 122, and 123) are provided, folding of the folding area FDA of the protective film 10_2 may be more easily performed and defects and the like that may occur during the folding operation may be more substantially suppressed or effectively prevented.

Figure 14:
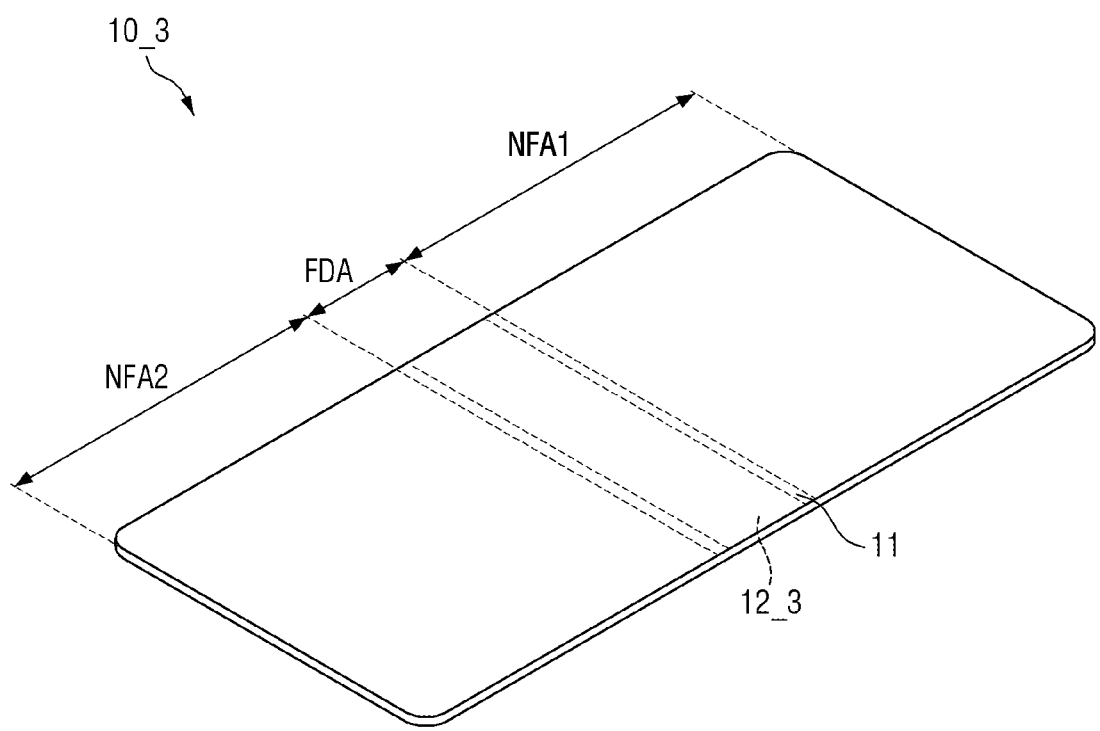
FIG. 14 is a perspective view of a protective film according to still another alternative embodiment.

FIG. 14 is a perspective view of a protective film according to still another alternative embodiment.

The embodiment shown in FIG. 14 is substantially the same as the embodiment of FIG. 5 except that a width (width in the second direction DR2) of a second region 12_3 is substantially the same as the width of the folding area FDA. In such an embodiment, sufficient impact resistance in the entire protective film 10_3 and sufficient flexibility in the folding area FDA may be ensured, and the efficiency of the process of forming the protective film 10_3 may be improved. In such an embodiment where the width of the second region 12_3 is substantially the same as the width of the folding area FDA, folding of the folding area FDA of the protective film 10_3 may be more easily performed and defects and the like that may occur during the folding operation may be more substantially suppressed or effectively prevented.

Figure 15:
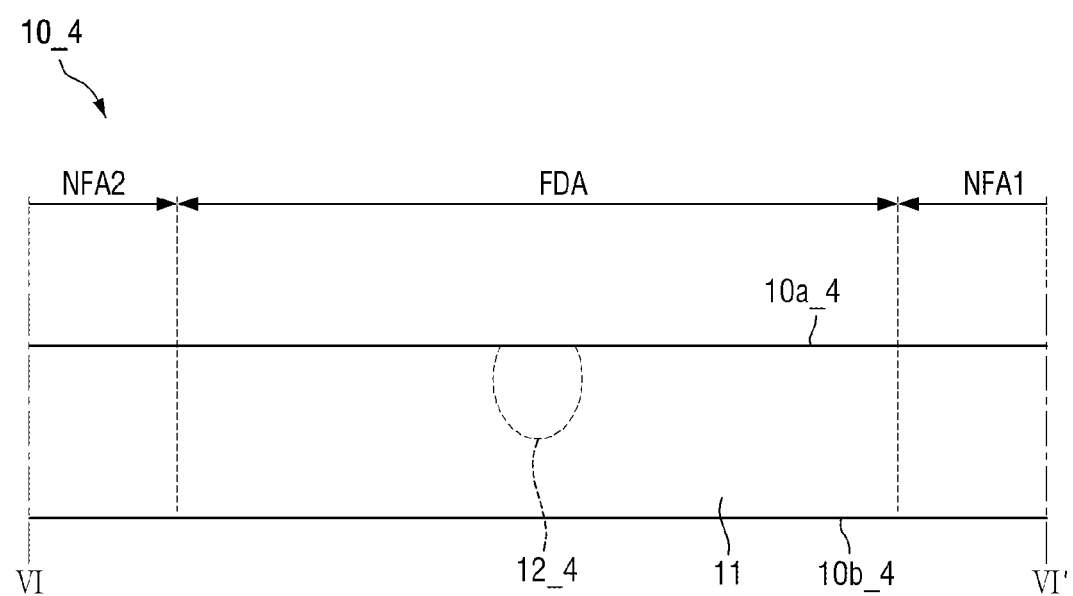
FIGS. 15 to 17 are cross-sectional views of protective films according to still other alternative embodiments.
Figure 16:
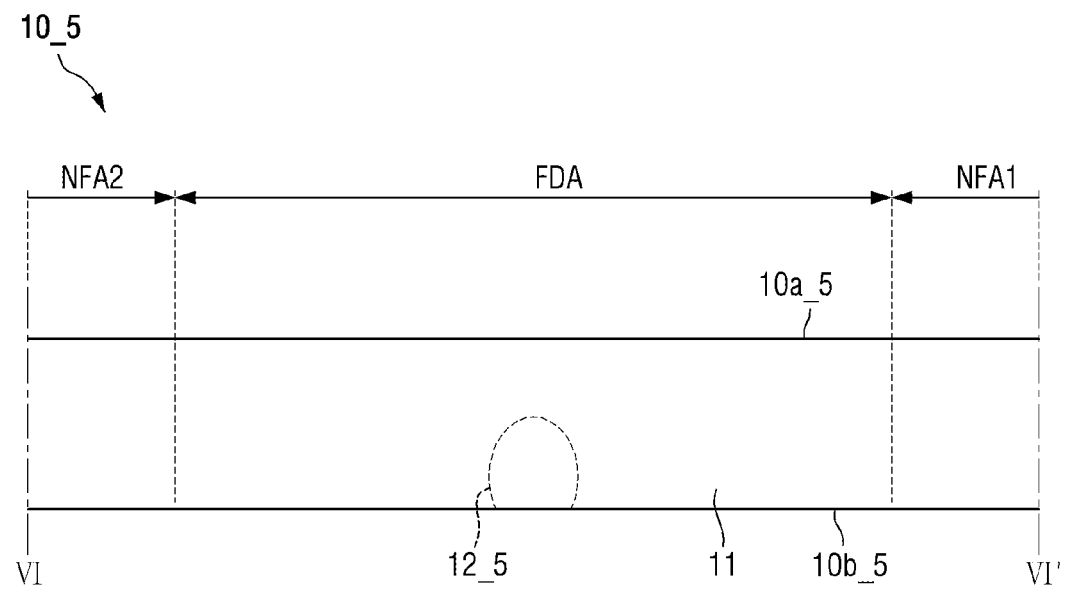
Figure 17:
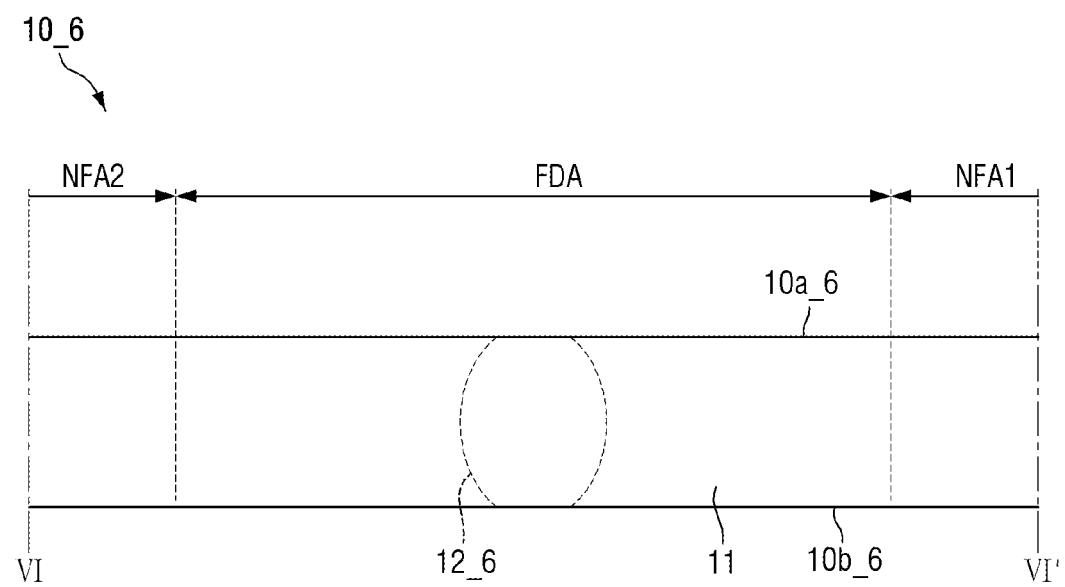

FIGS. 15 to 17 are cross-sectional views of protective films according to still other alternative embodiments. FIGS. 15 to 17 show various embodiments.

The embodiments shown in FIGS. 15 to 17 are substantially the same as the embodiment of FIG. 6 except that second regions 12_4, 12_5, and 12_6 of protective films 10_4, 10_5, and 10_6 may form a part of at least one of the first surfaces and the second surfaces of the protective films 10_4, 10_5, and 10_6, respectively.

Referring to FIG. 15, in an embodiment, an upper portion of the second region 12_4 of the protective film 10_4 may be exposed. In such an embodiment, the first surface 10a_4 of the protective film 10_4 may include a part of the second region 12_4 as well as the first region 11, and the second surface 10b_4 of the protective film 10_4 may include the first region 11. The first surface 10a_4 and the second surface 10b_4 of the protective film 10_4 may include the first region 11, and the first surface 10a_4 of the protective film 10_4 may further include the second region 12_4. In such an embodiment, the first surface 10a_4 and the second surface 10b_4 of the protective film 10_4 may include different regions from each other. In such an embodiment, the first surface 10a_4 of the protective film 10_4 may be entirely substantially flat.

Referring to FIG. 16, in an alternative embodiment, a lower portion of the second region 12_5 of the protective film 10_5 may be exposed. In such an embodiment, the second surface 10b_5 of the protective film 10_5 may include a part of the second region 12_5 as well as the first region 11, and the first surface 10a_5 may include the first region 11. The first surface 10a_5 and the second surface 10b_5 of the protective film 10_5 may include the first region 11, and the second surface 10b_5 may further include the second region 12_5. In such an embodiment, the first surface 10a_5 and the second surface 10b_5 of the protective film 10_5 may include different regions from each other. In such an embodiment, the second surface 10b_5 of the protective film 10_5 may be entirely substantially flat.

Referring to FIG. 17, in another alternative embodiment, upper and lower portions of the second region 12_6 of the protective film 10_6 may be exposed. In such an embodiment, the first surface 10a_6 and the second surface 10b_6 of the protective film 10_6 may include a part of the second region 12_6 as well as the first region 11. In such an embodiment, the thickness of the second region 12_6 of the protective film 10_6 may substantially the same as the thickness of the protective film 10_6. In such an embodiment, the first surface 10a_6 and the second surface 10b_6 of the protective film 10_6 may be entirely substantially flat.

In embodiments, as shown in FIGS. 15 to 17, the second region 12_4, 12_5, or 12_6 of the protective film 10_4, 10_5, or 10_6 may be formed in various sizes and various shapes at various locations in cross-sectional views depending on the position of the focus FC (see FIG. 9), the laser radiation time, the magnitude of the energy, and the like.

In such embodiments, sufficient impact resistance in the entire protective film 10_4, 10_5, or 10_6 and sufficient flexibility in the folding area FDA may be ensured, and the efficiency of the process of forming the protective film 10_4, 10_5, or 10_6 may be improved. In such embodiments, the stress applied to the protective film 10_4, 10_5, or 10_6 may be different depending on the thicknesses, the shapes, the degree of folding, the folded shapes and the like of the protective films 10_4, 10_5, and 10_6. By allowing the second region 12_4, 12_5, or 12_6 to have different positions, sizes, and shapes depending on the cases, sufficient impact resistance and sufficient flexibility may be ensured regardless of the thicknesses, the shapes, the degree of folding, the folded shapes, and the like of the protective film 10_4, 10_5, or 10_6.

Figure 18:
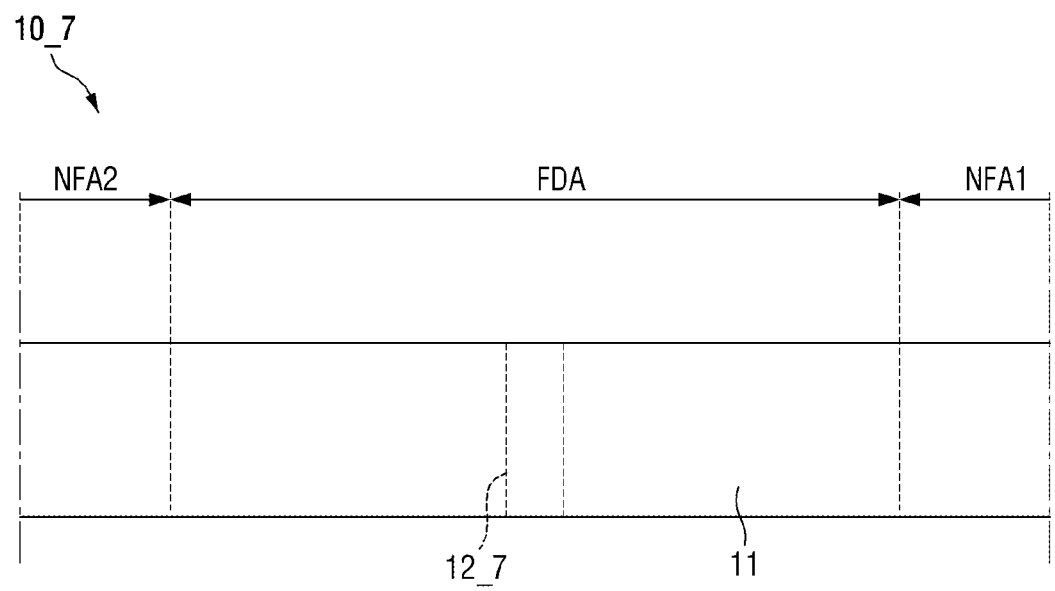
FIG. 18 is a cross-sectional view of a protective film according to still another alternative embodiment.
Figure 18:
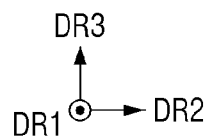

FIG. 18 is a cross-sectional view of a protective film according to still another alternative embodiment.

The embodiment of FIG. 18 is substantially the same as the embodiment of FIG. 6 except that a thickness (width in the third direction DR3) of a second region 12_7 of a protective film 10_7 is substantially the same as the thickness of the protective film 10_7. In such an embodiment, at least one of upper and lower portions of the second region 12_7 of the protective film 10_7 may be exposed to the outside. At least one of the first surface or the second surface of the protective film 10_7 may include the second region 12_7.

In such an embodiment, sufficient impact resistance in the entire protective film 10_7 and sufficient flexibility in the folding area FDA are ensured, and the efficiency of the process of forming the protective film 10_7 may be improved. In such an embodiment, since the thickness of the second region 12_7 is substantially the same as the thickness of the protective film 10_7, folding of the folding area FDA of the protective film 10_7 may be more easily performed and al defects and the like that may occur during the folding operation may be more substantially suppressed or effectively prevented.

Figure 19:
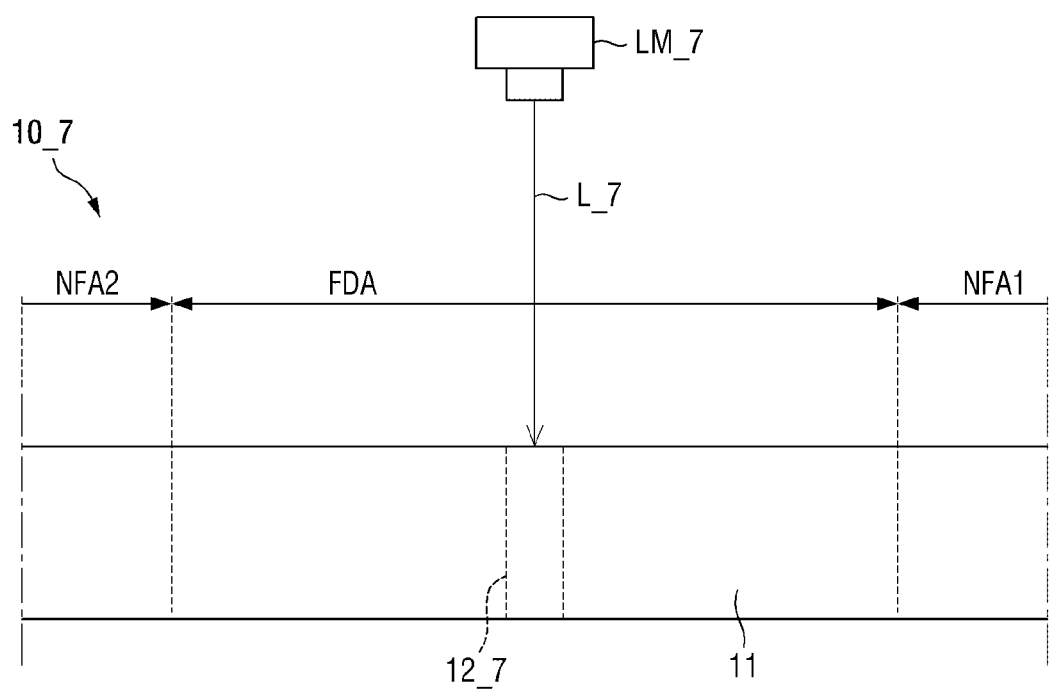
FIG. 19 is a diagram showing a method of manufacturing a display device including the protective film of FIG. 18 according to an embodiment.

FIG. 19 is a diagram showing a method of manufacturing a display device including the protective film of FIG. 18 according to an embodiment. FIG. 19 shows an embodiment of the method of manufacturing the display device 1 (see FIG. 1) including the protective film 10_7 of FIG. 18, but the method of manufacturing a display device is not limited thereto.

The embodiment of the method of manufacturing a display device shown in FIG. 19 is substantially the same as the embodiment of FIG. 9 except that the second region 12_7 of the protective film 10_7 is formed by an infrared laser.

In such an embodiment, a laser module LM_7 may form the second region 12_7 of the protective film 10_7 by emitting a laser L_7 toward the protective film 10_7. The laser module LM_7 may emit an infrared laser. In such an embodiment, the laser L_7 emitted from the laser module LM_7 may be the infrared laser.

In such an embodiment, since the laser module LM_7 emits the infrared laser with a relatively low energy, the physical property of a region having substantially the same thickness as the thickness of the protective film 10_7, rather than a partial region in the protective film 10_7, may be changed. In such an embodiment, since the laser module LM_7 emits the infrared laser, the second region 12_7 may be formed to extend from the top surface (or the first surface (see '10a' in FIG. 7) of the protective film 10_7 to the bottom surface (or the second surface (see '10b' in FIG. 7), rather than the partial region in the protective film 10_7.

In such an embodiment, by emitting the laser L_7, the physical property of the partial region (e.g., the second region 12_7) of the protective film 10_7 may be changed. Accordingly, the efficiency of the process of manufacturing the display device including the protective film 10_7 may be improved and the processing cost may be reduced.

Figure 20:
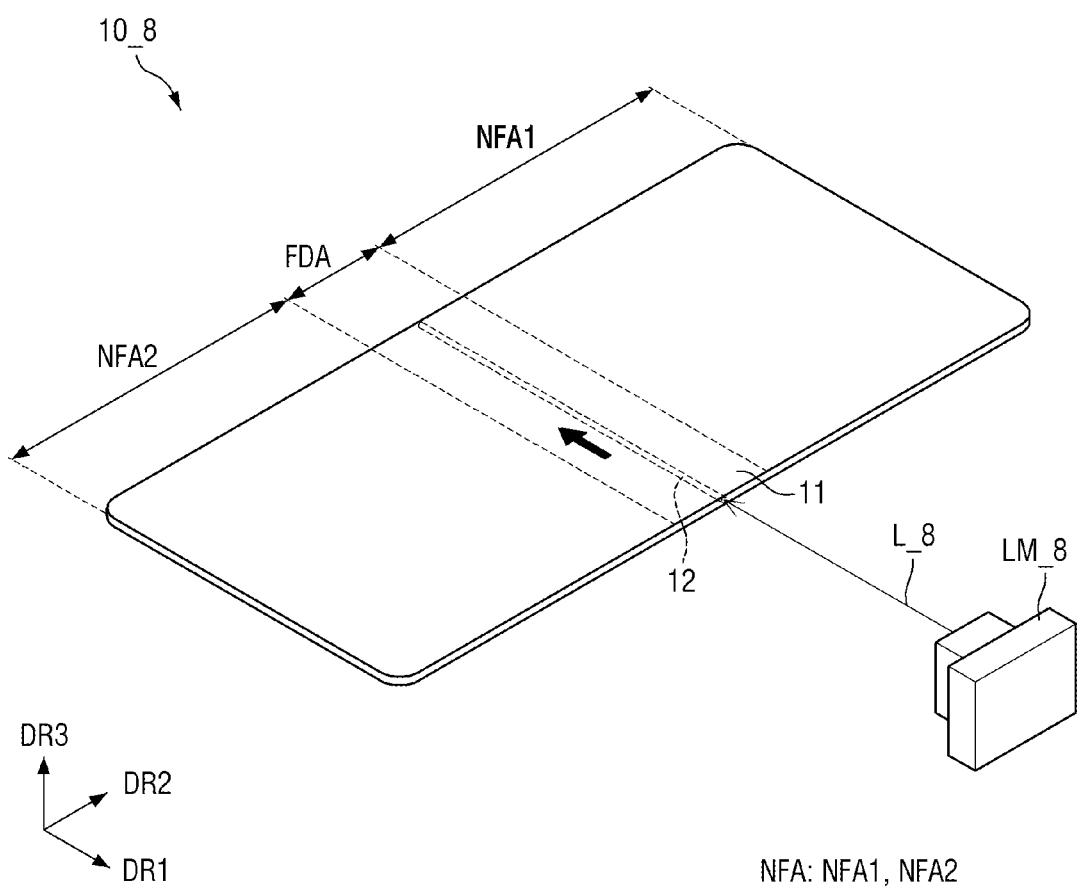
FIG. 20 is a diagram showing a method of manufacturing a display device including a protective film according to another alternative embodiment.

FIG. 20 is a diagram showing a method of manufacturing a display device including a protective film according to another alternative embodiment.

The embodiment of FIG. 20 is substantially the same as the embodiment of FIG. 8 except that a depth of focus of a laser L_8 forming the second region 12 of the protective film 10_8 is linear.

In an embodiment, a laser module LM_8 may include an Axicon lens, and the depth of focus of the laser L_8 emitted from the laser module LM_8 may be linear. In such an embodiment, the laser module LM_8 may be located on one side surface of the protective film 10_8 and may form the second region 12 in a fixed state. In one embodiment, for example, the laser module LM_8 may be located on one side of the protective film 10_8 in the first direction DR1 and emit the laser L_8 toward the side surface of the protective film 10_8, and the depth of focus of the laser L_8 may linearly extend in the first direction DR1. The depth of focus extending linearly in the first direction DR1 may be disposed in the protective film 10 and may form the second region 12.

In such an embodiment, by emitting the laser L_8, the physical property of the partial region (e.g., the second region 12) of the protective film 10_8 may be changed. Accordingly, the efficiency of the process of manufacturing the display device including the protective film 10_8 may be improved and also the processing cost may be reduced. In such an embodiment, since the laser module LM_8 may be fixed, the processing efficiency may be improved.

Figure 21:
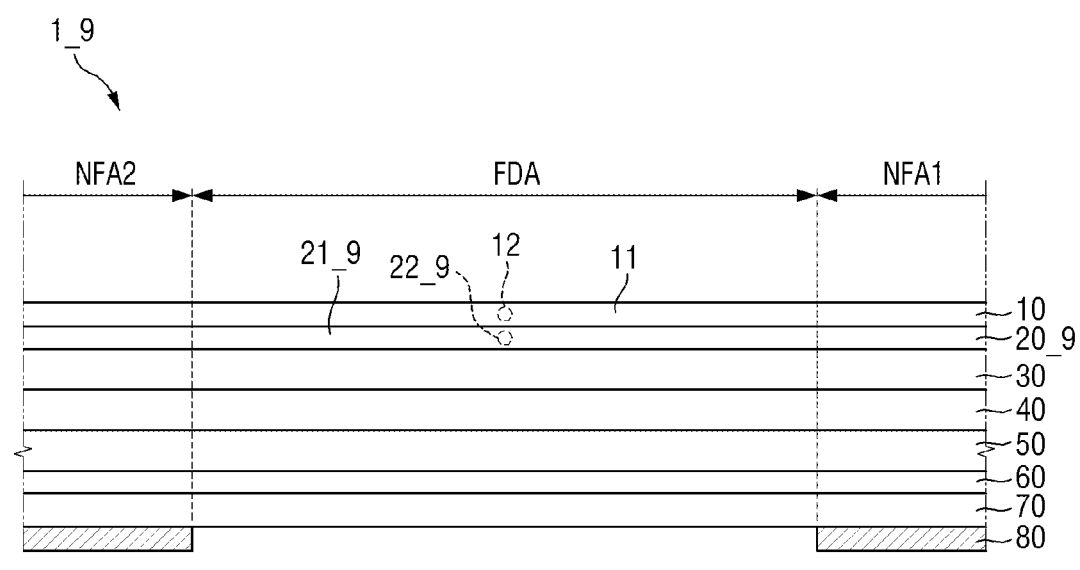
FIG. 21 is a cross-sectional view of a display device according to still another alternative embodiment.

FIG. 21 is a cross-sectional view of a display device according to still another alternative embodiment.

The embodiment of FIG. 21 is substantially the same as the embodiment of FIG. 3 except that a cover window 20_9 of a display device 1_9 includes a third region 21_9 and a fourth region 22_9 having different physical properties from each other.

In such an embodiment, the third region 21_9 and the fourth region 22_9 of the cover window 20_9 may be formed in substantially the same manner as the first region 11 and the second region 12 of the protective film 10. The positions and the shapes of the third region 21_9 and the fourth region 22_9 of the cover window 20_9 may be substantially the same as the positions and the shapes of the first region 11 and the second region 12 of the protective film 10.

The third region 21_9 and the fourth region 22_9 of the cover window 20_9 have different physical properties from each other, and the relationship between the physical property of the third region 21_9 and the physical property of the fourth region 22_9 of the cover window 20_9 may be substantially the same as the relationship between the physical property of the first region 11 and the physical property of the second region 12 of the protective film 10. In one embodiment, for example, the third region 21_9 of the cover window 20_9 may have a higher density, a higher light transmittance, and a higher modulus than those of the fourth region 22_9, and the fourth region 22_9 may have a higher creep property than that of the third region 21_9. The values of the physical properties of the third region 21_9 and the fourth region 22_9 of the cover window 20_9 may be different from the values of the physical properties of the first region 11 and the second region 12 of the protective film 10.

In such an embodiment, sufficient impact resistance in the entire protective film 10 and sufficient flexibility in the folding area FDA may be ensured, and also the efficiency of the process of forming the protective film 10 may be improved. In such an embodiment, by changing the physical property of the partial region (e.g., the fourth region 22_9) of the cover window 20_9, folding of the display device 1_9 may be more easily performed and defects and the like that may occur during the folding operation may be substantially suppressed or effectively prevented.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device including a folding area, the display device comprising:
   a display panel;
   a cover window disposed above the display panel;
   a bonding member disposed between the display panel and the cover window; and
   a protective film disposed on the cover window, wherein the cover window is disposed between the protective film and the bonding member, and a portion of the protective film corresponding to the folding area includes a first region and a second region including a same polymer material as each other and having different moduli from each other,
   wherein a modulus of the second region of the protective film is less than a modulus of the first region,
   the modulus of the first region is an average elastic modulus of the first region, and the modulus of the second region is an average elastic modulus of the second region,
   the second region is disposed in the folding area, and
   an atomic or molecular arrangement structure of the same polymer material in the second region is different from the atomic or molecular arrangement structure of the polymer same material in the first region.

2. The display device of claim 1, wherein the modulus of the first region is in a range of about 2 times to about 7 times the modulus of the second region.

3. The display device of claim 2, wherein
   the modulus of the first region is in a range of about 6 GPa to about 7 GPa, and
   the modulus of the second region is in a range of about 1.5 GPa to about 2.5 GPa.

4. The display device of claim 3, wherein a density of the first region is greater than a density of the second region.

5. The display device of claim 4, wherein
   the density of the first region is in a range of about 1.3 $g/cm^3$ to about 1.5 $g/cm^3$, and
   the density of the second region is in a range of about 1.1 $g/cm^3$ to about 1.2 $g/cm^3$.

6. The display device of claim 3, wherein a light transmittance of the first region is greater than a light transmittance of the second region.

7. The display device of claim 1, wherein a thickness of the second region of the protective film is the same as a thickness of the protective film.

8. The display device of claim 1, wherein the second region of the protective film is surrounded by the first region in a cross-sectional view.

9. The display device of claim 1, wherein
   the folding area extends in a first direction, and
   the second region extends in the first direction.

10. The display device of claim 9, further comprising:
    a non-folding area disposed at opposing sides of the folding area in a second direction perpendicular to the first direction,
    wherein the first region is disposed in the folding area and the non-folding area.

11. The display device of claim 10, wherein
    the second region is provided in plural, and
    a plurality of second regions is arranged along the second direction and spaced apart from each other in the second direction.

12. The display device of claim 1, wherein
    the folding area extends in a first direction,
    the second region is provided in plural, and
    a plurality of second regions is arranged along the first direction and spaced apart from each other in the first direction.

13. The display device of claim 1, wherein at least a part of a region between the first region and the second region has no physical boundary.

14. The display device of claim 1, wherein the cover window includes a third region and a fourth region having different moduli from each other.

15. The display device of claim 14, wherein
    the fourth region is disposed in the folding area, and
    a modulus of the fourth region is less than a modulus of the third region.

* * * * *